United States Patent
Melanson et al.

(10) Patent No.: US 9,723,578 B2
(45) Date of Patent: Aug. 1, 2017

(54) RANDOM TELEGRAPH SIGNAL IDENTIFICATION AND MEASUREMENT

(71) Applicant: Cirrus Logic International Semiconductor Ltd., Edinburgh (GB)

(72) Inventors: John L. Melanson, Austin, TX (US); Aaron J. Brennan, Austin, TX (US); Justin Dougherty, Austin, TX (US); Ramya Balasundaram, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 15/175,871

(22) Filed: Jun. 7, 2016

(65) Prior Publication Data

US 2016/0366656 A1    Dec. 15, 2016

Related U.S. Application Data

(60) Provisional application No. 62/173,075, filed on Jun. 9, 2015.

(51) Int. Cl.
*G01R 31/308* (2006.01)
*H04W 52/36* (2009.01)
(Continued)

(52) U.S. Cl.
CPC ......... *H04W 52/367* (2013.01); *G01R 31/311* (2013.01); *H04W 52/32* (2013.01); *G01R 31/2837* (2013.01); *G01R 31/2875* (2013.01)

(58) Field of Classification Search
CPC ............. H01L 23/544; H01L 21/02354; H01L 21/02675; G01R 31/31816; G01R 31/311;
(Continued)

(56) References Cited

U.S. PATENT DOCUMENTS

| 4,430,897 A * | 2/1984 | Quate .................... G01H 3/125 374/5 |
| 5,349,167 A * | 9/1994 | Simcock ............... F27B 14/061 219/656 |

(Continued)

FOREIGN PATENT DOCUMENTS

| JP | 2009115764 A | 5/2009 |
| JP | 2012037310 A | 2/2012 |

OTHER PUBLICATIONS

International Search Report and Written Opinion of the International Searching Authority, International Application No. PCT/EP2016/063072, mailed Aug. 26, 2016.
(Continued)

*Primary Examiner* — Dominic Rego
(74) *Attorney, Agent, or Firm* — Jackson Walker L.L.P.

(57) ABSTRACT

In accordance with embodiments of the present disclosure, a method for identifying a location of an integrated circuit that is sensitive to RTS noise may include applying localized heat to a scan area of the integrated circuit, observing any change in one or more electrical parameters of the integrated circuit in response to the localized heat being applied to the scan area indicative of sensitivity to RTS noise, and identifying the location sensitive to RTS noise responsive to observing change in one or more electrical parameters of the integrated circuit indicative of sensitivity to RTS noise in response to the localized heat being applied to the scan area.

18 Claims, 5 Drawing Sheets

(51) Int. Cl.
*H04W 52/32* (2009.01)
*G01R 31/311* (2006.01)
*G01R 31/28* (2006.01)

(58) Field of Classification Search
CPC ... G01R 31/2837; G03F 7/70025; H01S 1/00;
H01S 3/00; H01S 3/0912; H04W 52/367;
H04W 52/32
USPC ........ 324/754.23; 340/557; 348/67; 438/487
See application file for complete search history.

(56) References Cited

U.S. PATENT DOCUMENTS

| | | | |
|---|---|---|---|
| 6,034,978 A * | 3/2000 | Ujazdowski | G03F 7/70025 |
| | | | 372/34 |
| 6,549,022 B1 | 4/2003 | Cole, Jr. et al. | |
| 2004/0169840 A1* | 9/2004 | Hoashi | G01S 7/486 |
| | | | 356/4.01 |
| 2005/0006602 A1* | 1/2005 | Perdu | G01R 31/31816 |
| | | | 250/492.22 |
| 2005/0213074 A1* | 9/2005 | Hoashi | G01C 3/08 |
| | | | 356/4.09 |
| 2007/0229096 A1* | 10/2007 | Chu | G01R 31/2881 |
| | | | 324/754.23 |
| 2009/0216494 A1* | 8/2009 | Stadler | H04B 10/0773 |
| | | | 702/183 |
| 2010/0327875 A1 | 12/2010 | Patterson | |
| 2011/0115510 A1 | 5/2011 | Colvin | |
| 2016/0064296 A1* | 3/2016 | Suzumura | H01L 22/34 |
| | | | 257/48 |
| 2016/0116925 A1* | 4/2016 | Freeman | H02M 3/33546 |
| | | | 307/130 |
| 2016/0260811 A1* | 9/2016 | Ozcan | H01L 29/41783 |

OTHER PUBLICATIONS

Chang, Liang-Shun et al., "Temperature Sensing Scheme Through Random Telegraph Noise in Contact RRAM", IEEE Electron Device Letters, IEEE Service Center, New York, NY, US, vol. 34, No. 1, Jan. 1, 2013, pp. 12-14.

Pogany, D et al., "Study of RTS Noise and Excess Currents in Lattice-Mismatched inP/InGaAs/InP Photodetector Arrays", Solid State Electronics, Elsevier Science Publishers, Barking, GB, vol. 38, No. 1, Jan. 1, 2005, pp. 37-49.

* cited by examiner

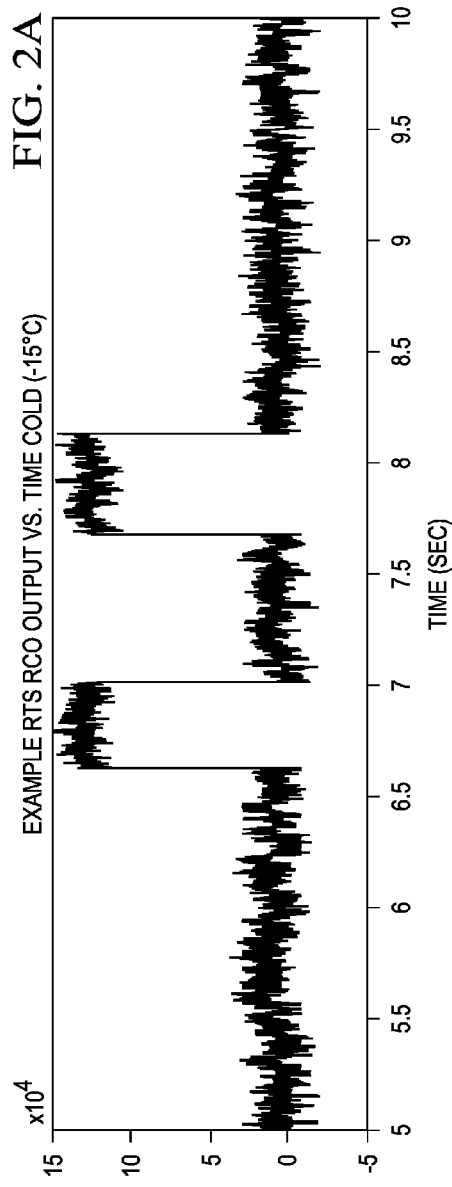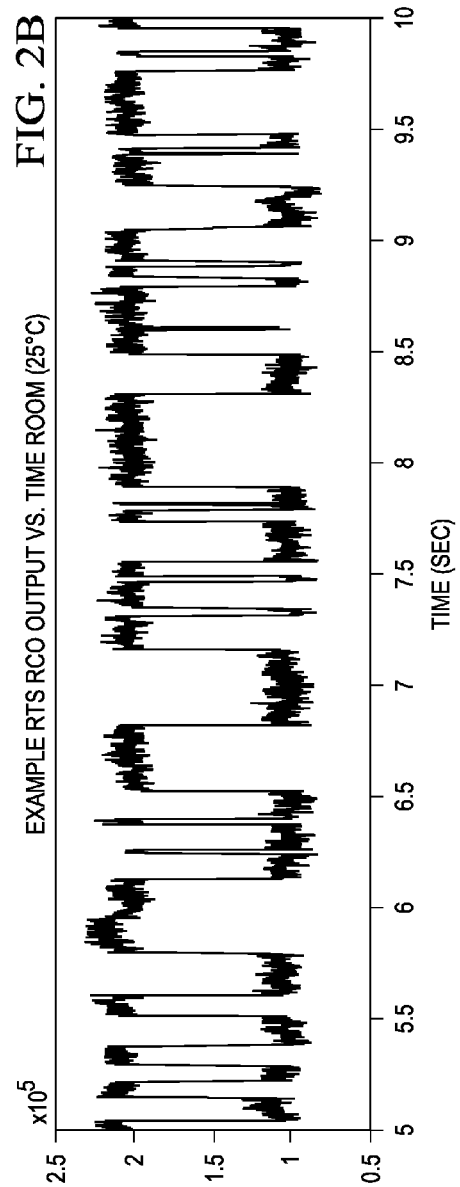

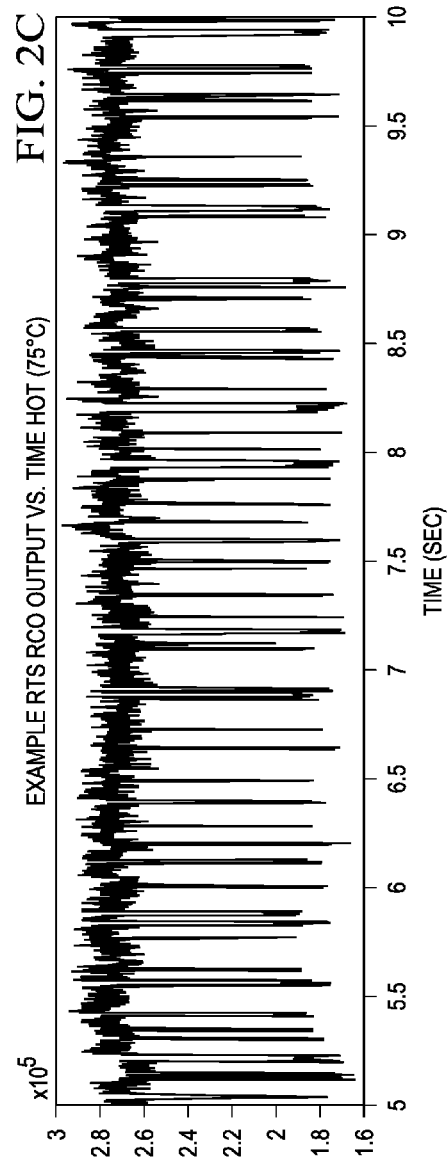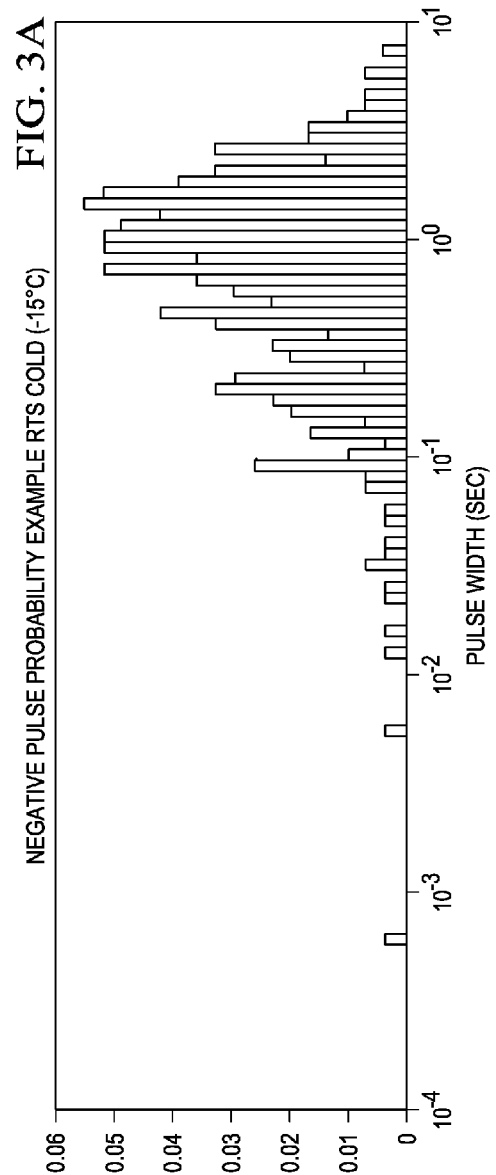

RANDOM TELEGRAPH SIGNAL IDENTIFICATION AND MEASUREMENT

RELATED APPLICATIONS

The present disclosure claims priority to U.S. Provisional Patent Application Ser. No. 62/173,075, filed Jun. 9, 2015, which is incorporated by reference herein in its entirety.

FIELD OF DISCLOSURE

The present disclosure relates in general to testing and validation of electronic circuits, including without limitation methods and systems for identifying a semiconductor device or a portion thereof that exhibits low-frequency random telegraph signal (RTS) noise by local modification of such device's activation energy.

BACKGROUND

Low-frequency random telegraph signal (RTS) noise (also known as burst noise, popcorn noise, impulse noise, and bi-stable noise) is a type of electronic noise known to occur in semiconductor devices, including in metal-oxide-semiconductor field-effect transistor (MOSFET) circuits or devices. RTS noise typically comprises sudden step-like transitions between two or more discrete current or voltage levels, often as high as several hundred microvolts, and often at random and unpredictable times. RTS noise may be created by the capture and emission of charge carriers and may result in two distinct states. Simulation models of RTS noise are not widely available, leading to the probability that a design with an unexpected sensitivity to RTS may be discovered after manufacturing of the semiconductor chip. Semiconductor dice with sensitive analog circuits or memories can exhibit a large RTS signature in a subset of the population of manufactured dice.

SUMMARY

In accordance with the teachings of the present disclosure, one or more disadvantages and problems associated with existing approaches to identifying and measuring RTS noise may be reduced or eliminated.

In accordance with embodiments of the present disclosure, a method for identifying a location of an integrated circuit that is sensitive to RTS noise may include applying localized heat to a scan area of the integrated circuit, observing any change in one or more electrical parameters of the integrated circuit in response to the localized heat being applied to the scan area indicative of sensitivity to RTS noise, and identifying the location sensitive to RTS noise responsive to observing change in one or more electrical parameters of the integrated circuit indicative of sensitivity to RTS noise in response to the localized heat being applied to the scan area.

In accordance with these and other embodiments of the present disclosure, a system for identifying a location of an integrated circuit that is sensitive to RTS noise may include a heat-generating device configured to apply localized heat to a scan area of the integrated circuit, RTS measurement equipment configured to observe any change in one or more electrical parameters of the integrated circuit indicative of sensitivity to RTS noise in response to the localized heat being applied to the scan area, and an RTS processing and system control configured to identify the location sensitive to RTS noise responsive to observing change in one or more electrical parameters of the integrated circuit indicative of sensitivity to RTS noise in response to the localized heat being applied to the scan area.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein:

FIGS. 2A-2C illustrate graphs depicting example measurements for an output of a resistor-capacitor oscillator versus time at three different temperatures, in accordance with embodiments of the present disclosure;

FIGS. 3A-3C illustrate graphs depicting example histograms of negative pulse probability for the frequency measurements depicted in FIGS. 2A-2C, in accordance with embodiments of the present disclosure.

DETAILED DESCRIPTION

Figure 1:
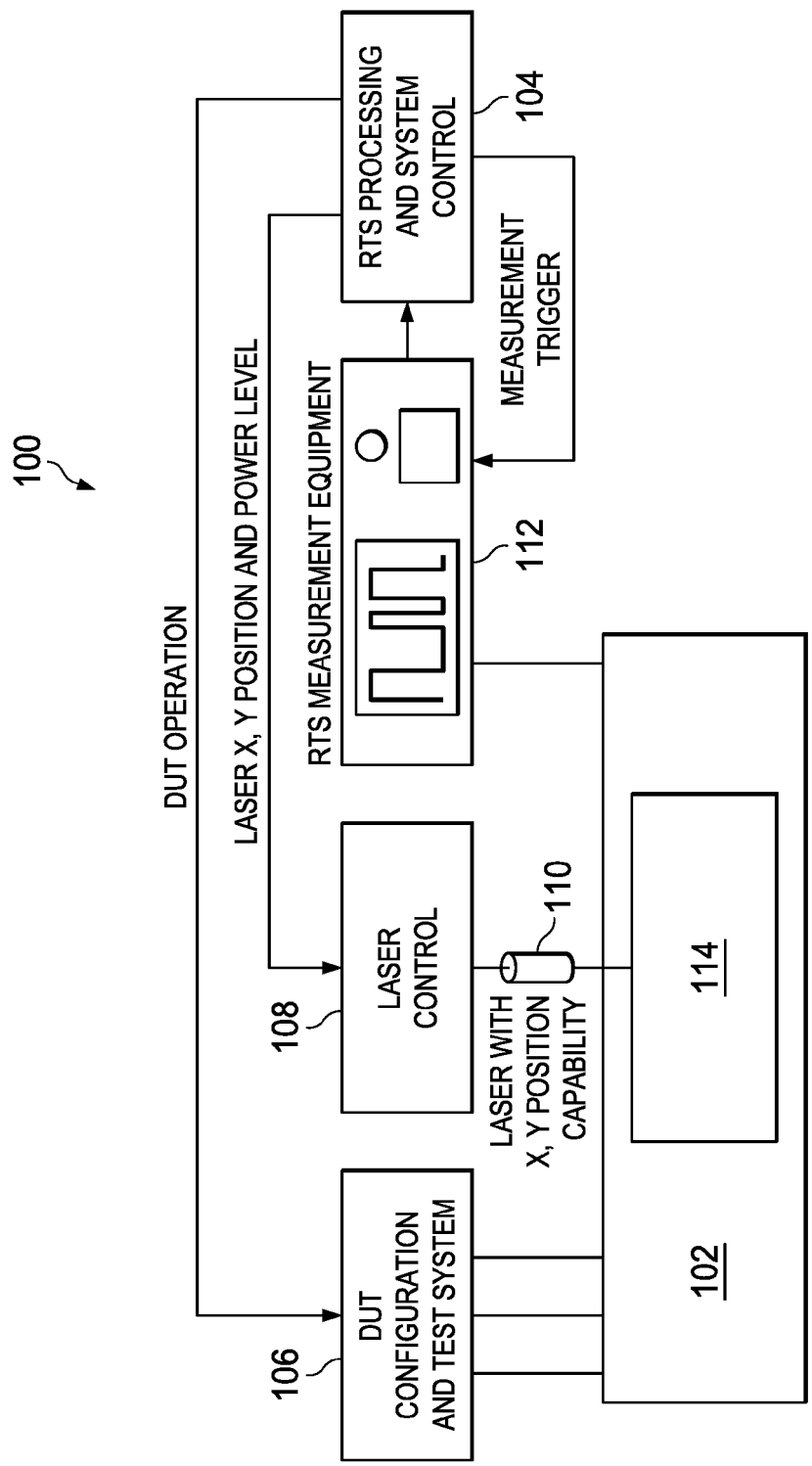
FIG. 1 illustrates a diagram of an example system for identification and measurement of RTS noise within a semiconductor device, in accordance with embodiments of the present disclosure.

FIG. 1 illustrates a diagram of an example system 100 for identification and measurement of RTS noise within a semiconductor device under test (DUT) 102, in accordance with embodiments of the present disclosure. DUT 102 may comprise a semiconductor die with one or more integrated circuits performed thereon. As shown in FIG. 1, system 100 may include an RTS processing and system control module 104, a DUT configuration and test system 106, a laser control system 108, a laser 110, and RTS measurement equipment 112.

Processing and system control module 104 may comprise any suitable system, device, or apparatus for controlling DUT configuration and test system 106, laser control system 108, and RTS measurement equipment 112, and/or configured to receive test information from RTS measurement equipment 112. Processing and system control module 104 may be embodied in hardware, software, firmware, or a combination thereof. Functionality of processing and system control module 104 is described in greater detail below.

DUT configuration and test system 106 may comprise any suitable system, device, or apparatus for applying one or more test vectors of electronic stimuli to DUT 102 in order to perform analysis of DUT 102 in order to characterize operation of DUT 102, detect defects in DUT 102, and/or conduct other tests of DUT 102. In applying the electronic stimuli applied to DUT 102, DUT configuration and test system 106 may be controlled by processing and system control module 104. DUT configuration and test system 106 may be embodied in hardware, software, firmware, or a combination thereof.

Laser control system 108 may comprise any suitable system, device, or apparatus for controlling an intensity, wavelength, and/or position of laser 110 with respect to DUT 102. Laser control system 108 may be embodied in hardware, software, firmware, or a combination thereof.

Laser 110 may comprise any suitable system, device, or apparatus for generating a focused, collimated beam of photonic energy. In some embodiments, laser 110 may also include a motor or other electromechanical apparatus under the control of laser control system 108 for translation in directions parallel to a surface of DUT 102, such that laser control system 108 may control a position of laser 110 in order to direct photonic energy of laser 110 to a specific location or locations (e.g., within scan area 114 shown in FIG. 1) on DUT 102. In some embodiments, laser 110 is selected to have a wavelength that will create a desired change in activation energy of fabricated components of DUT 102 (e.g., by applying localized heat), but will not otherwise significantly affect other electrical characteristics of DUT 102 (e.g., the selected wavelength will not cause significant generation of electron-hole pairs in the semiconductor substrate of DUT 102). Although scan area 114 is shown in FIG. 1 as being a portion of DUT 102, in some embodiments, a scan area 114 may include the entirety of DUT 102.

RTS measurement equipment 112 may comprise any suitable system, device, or apparatus for reading one or more selected electrical parameters generated from test vectors applied by DUT configuration and test system 106 in order to detect the presence of any RTS noise in DUT 102. For example, electrical parameters that may be detected to indicate presence of RTS noise may include modulation of frequency in an oscillation circuit integral to DUT 102, modulation of an output signal of an amplifier integral to DUT 102, current modulation of a transistor or circuit integral to DUT 102, voltage modulation of a transistor or circuit integral to DUT 102, modulation of retention in a flash memory integral to DUT 102, random noise in an image sensor, and other electrical parameters.

In operation, system 100 may identify and measure RTS noise by applying localized heat to a scan area 114 using laser 110 which may create a local change in activation energy (e.g., a decrease in activation energy) and by measuring changes in electrical parameters induced by such heat (e.g., with RTS measurement equipment 112), identify coordinates of DUT 102 in which RTS noise responds to changes in temperature. Although the discussion herein contemplates applying heat with photonic energy from a laser, other embodiments may use other approaches for heating of a scan area 114. Thus, system 100 may enable an operator of system 100 to identify portions (e.g. one or more scan areas 114) in which one or more semiconductor structures (e.g., MOSFETs) which generate RTS noise are expected to be located. For example, system 100 may cause laser 110 to move such that its beam "scans" across a scan area 114 to generate localized heating. Laser 110 may move in discrete steps or at a rate slow enough to allow the capture of an RTS measurement for each scan area 114. RTS measurement equipment 112 may measure electrical parameters (e.g., average pulse width for the observed RTS noise) for each scan area 114 until all scan areas 114 of DUT 102 have been fully tested. The location of a semiconductor structure (e.g., MOSFET) responsible for creating excessive RTS noise is determined by correlating the X,Y coordinates of laser 110 with a change in measured electrical parameters (e.g., a decrease in an observed average pulse width).

As a particular example of identification and measurement of RTS noise, RTS measurement equipment 112 may measure a pulse width of a resistive-capacitive oscillator to determine any presence of RTS noise. An average pulse width of RTS noise is a strong function of activation energy, and heating an area of semiconductor substrate including an integrated circuit exhibiting RTS noise is likely to lower such activation energy, thus resulting in a decrease in average pulse width associated with the RTS noise. For example, such relationship between heat-induced activation energy and pulse width is shown in FIGS. 2A-2C, which illustrate graphs depicting example measurements for an output of an RTS-noise generating resistor-capacitor oscillator versus time at three different temperatures (e.g., −15° C., 25° C., and 75° C.), in accordance with embodiments of the present disclosure. As seen in FIGS. 2A-2C, RTS noise may cause the output of a resistive-capacitive oscillator to occasionally change frequency. Accordingly, RTS noise may be characterized by the average pulse width of these discrete changes in frequency.

Figure 3B:
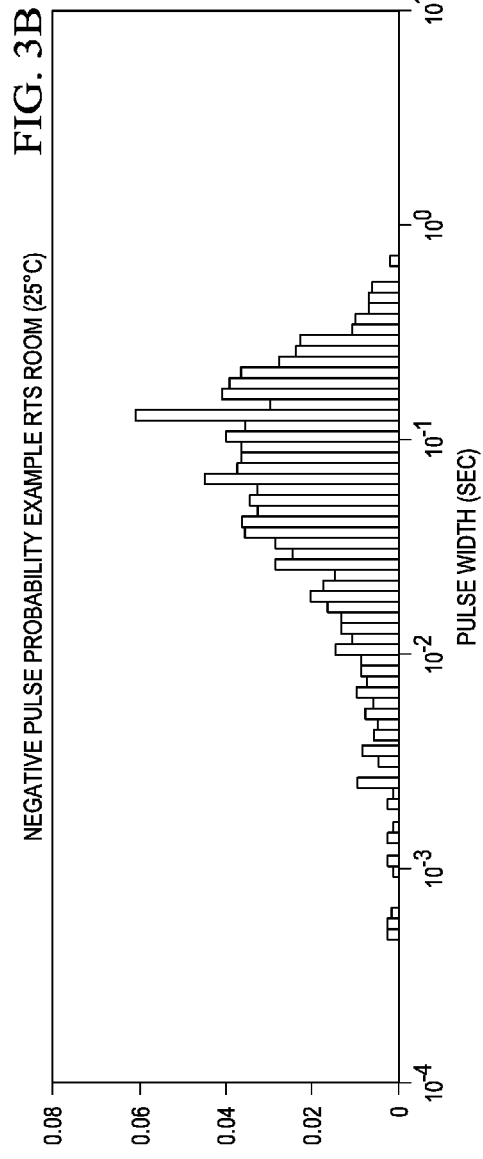
Figure 3C:
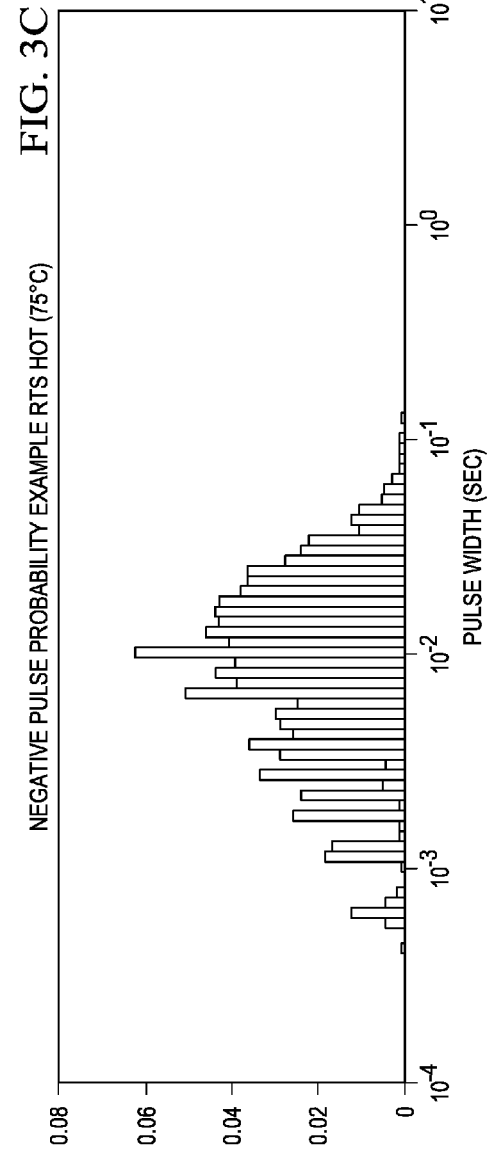

Statistics gathered (e.g., by RTS measurement equipment 112 and/or RTS processing and system control 104) from the relationship illustrated in FIGS. 2A-2C may be used to create the data represented graphically in FIGS. 3A-3C, which illustrate graphs depicting example histograms of negative pulse probability from the measurements depicted in FIGS. 2A-2C, in accordance with embodiments of the present disclosure. FIGS. 3A-3C show that as heat is applied to a scan area 114 having structures that generate RTS noise, and the temperature of such scan area 114 is increased from −15° C. to −25° C. to 75° C. (thus decreasing the activation energy for such scan area 114), the average pulse widths for RTS noise in such scan area 114 decreases at a logarithmic rate. Such a change (e.g., decreasing pulse width with increasing temperature) may indicate that such scan area is associated with and/or located proximate to a semiconductor structure (e.g., MOSFET) that is a source of excessive RTS noise of DUT 102. This logarithmically decreasing characteristic thus allows ease in observing presence of RTS noise, as small change in temperature may lead to a significant response in measurement.

Thus, using the method and systems disclosed herein, system 100 may observe a plurality of discrete noise levels, and measure such noise levels to determine a source of RTS noise. In addition or alternatively, system 100 may analyze a multi-modal histogram (as shown in FIGS. 3A-3C) created by RTS noise.

Figure 4:
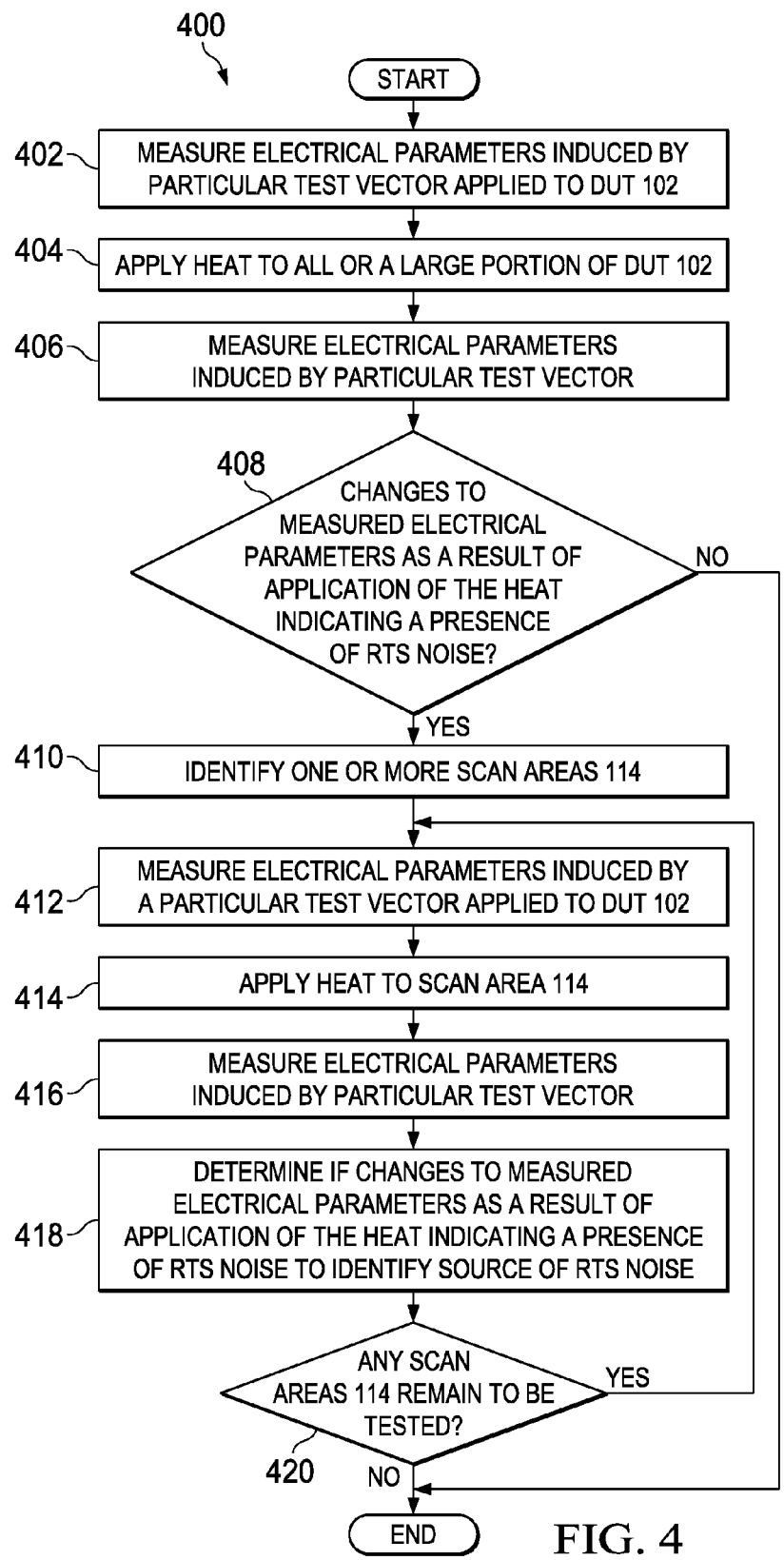
FIG. 4 illustrates a flowchart of an example method for identification and measurement of RTS noise within a semiconductor device, in accordance with embodiments of the present disclosure.

FIG. 4 illustrates a flowchart of an example method 400 for identification and measurement of RTS noise within a semiconductor device, in accordance with embodiments of the present disclosure. According to certain embodiments, method 400 may begin at step 402. As noted above, teachings of the present disclosure may be implemented in a variety of configurations of system 100 as shown in FIG. 1. As such, the preferred initialization point for method 400 and the order of the steps comprising method 400 may depend on the implementation chosen. In these and other embodiments, method 400 may be implemented as firmware, software, applications, functions, libraries, or other instructions.

At step 402, system 100 may measure electrical parameters induced by a particular test vector applied to DUT 102 (e.g., by DUT configuration and test system 106). At step 404, system 100 may (e.g., using laser 110) apply heat to all or a large portion of DUT 102. At step 406, system 100 may measure electrical parameters induced by the particular test vector. In some embodiments, steps 404 and 406 may be repeated at multiple temperatures. At step 408, system 100 may determine if any changes have occurred to the measured electrical parameters as a result of application of the heat that indicate a presence of RTS noise. If changes have occurred to the measured electrical parameters as a result of application of the heat that indicate a presence of RTS noise, method 400 may proceed to step 410. Otherwise, method 400 may end.

At step 410, system 100 may identify one or more scan areas 114. At step 412, for one of such scan areas, system 100 may measure electrical parameters induced by a particular test vector applied to DUT 102 (e.g., by DUT configuration and test system 106). At step 414, system 100 may (e.g., using laser 110) apply heat to such scan area 114. At step 416, system 100 may measure electrical parameters induced by the particular test vector. In some embodiments, steps 414 and 416 may be repeated at multiple temperatures. At step 418, system 100 may determine if any changes have occurred to the measured electrical parameters as a result of application of the heat that indicate a presence of RTS noise in the scan area 114. At step 420, system 100 may determine if any scan areas 114 remain to be tested. If any scan areas 114 remain to be tested, steps 412 through 418 may be repeated for such scan areas 114 to identify which scan areas 114 exhibit characteristics of RTS noise. Otherwise, method 400 may end. In some embodiments, such identified scan areas 114 may be further analyzed (e.g., broken up into smaller scan areas with the heating and analysis steps described above repeated) in order to more precisely identify a location on DUT 102 which is a source of RTS noise.

Although FIG. 4 discloses a particular number of steps to be taken with respect to method 400, method 400 may be executed with greater or fewer steps than those depicted in FIG. 4. In addition, although FIG. 4 discloses a certain order of steps to be taken with respect to method 400, the steps comprising method 400 may be completed in any suitable order.

Method 400 may be implemented using system 100, components thereof, or any other system such as those shown in FIG. 1 operable to implement method 400. In certain embodiments, method 400 may be implemented partially or fully in software and/or firmware embodied in computer-readable media.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the exemplary embodiments herein that a person having ordinary skill in the art would comprehend. Similarly, where appropriate, the appended claims encompass all changes, substitutions, variations, alterations, and modifications to the exemplary embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative.

All examples and conditional language recited herein are intended for pedagogical objects to aid the reader in understanding the invention and the concepts contributed by the inventor to furthering the art, and are construed as being without limitation to such specifically recited examples and conditions. Although embodiments of the present inventions have been described in detail, it should be understood that various changes, substitutions, and alterations could be made hereto without departing from the spirit and scope of the disclosure.

What is claimed is:

1. A method for identifying a location of an integrated circuit that is sensitive to random telegraph signal (RTS) noise, comprising:
    applying localized heat to a scan area of the integrated circuit;
    observing any change in one or more electrical parameters of the integrated circuit in response to the localized heat being applied to the scan area indicative of sensitivity to RTS noise; and
    identifying the location sensitive to RTS noise responsive to observing change in one or more electrical parameters of the integrated circuit indicative of sensitivity to RTS noise in response to the localized heat being applied to the scan area.

2. The method of claim 1, further comprising repeating the applying, observing, and identifying steps for at least one other scan area of the integrated circuit.

3. The method of claim 1, further comprising, in response to observing the change in one or more electrical parameters of the integrated circuit in response to the localized heat being applied to the scan area indicative of sensitivity to RTS noise:
    identifying at least one smaller scan area from the scan area;
    applying localized heat to the at least one smaller scan area;
    observing any change in one or more electrical parameters of the integrated circuit indicative of sensitivity to RTS noise in response to the localized heat being applied to the at least one smaller scan area; and
    identifying the location sensitive to RTS noise responsive to observing change in one or more electrical parameters of the integrated circuit indicative of sensitivity to RTS noise in response to the localized heat being applied to the at least one smaller scan area.

4. The method of claim 1, further comprising identifying a semiconductor structure proximate to the location as a source of the RTS noise.

5. The method of claim 4, wherein the semiconductor structure comprises a metal-oxide-semiconductor field-effect transistor.

6. The method of claim 1, wherein observing any change in one or more electrical parameters of the integrated circuit indicative of sensitivity to RTS noise in response to the localized heat being applied to the scan area comprises observing average pulse widths of an electrical signal as a function of temperature of a scan area applied by the localized heat.

7. The method of claim 1, wherein applying localized heat to a scan area of the integrated circuit comprises applying photonic energy to the scan area.

8. The method of claim 7, wherein applying photonic energy to the scan area comprises applying photonic energy generated by a laser to the scan area.

9. The method of claim 1, further comprising:
applying heat to an entirety of the integrated circuit;
observing any change in one or more electrical parameters of the integrated circuit in response to the heat being applied to the entirety of the integrated circuit;
identifying whether the integrated circuit is sensitive to RTS noise responsive to observing change in one or more electrical parameters of the integrated circuit indicative of sensitivity to RTS noise in response to the heat being applied to the entirety of the integrated circuit; and
responsive to identifying the integrated circuit is sensitive to RTS noise, performing the steps of applying localized heat to the scan area, observing any change in one or more electrical parameters of the integrated circuit in response to the localized heat being applied to the scan area, and identifying the location sensitive to RTS noise.

10. A system for identifying a location of an integrated circuit that is sensitive to random telegraph signal (RTS) noise, comprising:
a heat-generating device configured to apply localized heat to a scan area of the integrated circuit;
RTS measurement equipment configured to observe any change in one or more electrical parameters of the integrated circuit indicative of sensitivity to RTS noise in response to the localized heat being applied to the scan area; and
an RTS processing and system control configured to identify the location sensitive to RTS noise responsive to observing change in one or more electrical parameters of the integrated circuit indicative of sensitivity to RTS noise in response to the localized heat being applied to the scan area.

11. The system of claim 10, wherein:
the heat-generating device is further configured to apply localized heat to at least one other scan area of the integrated circuit;
the RTS measurement equipment is further configured to observe any change in one or more electrical parameters of the integrated circuit indicative of sensitivity to RTS noise in response to the localized heat being applied to the at least one other scan area; and
the RTS processing and system control is further configured to identify the location sensitive to RTS noise responsive to observing change in one or more electrical parameters of the integrated circuit indicative of sensitivity to RTS noise in response to the localized heat being applied to the at least one other scan area.

12. The system of claim 10, wherein, in response to observing the change in one or more electrical parameters of the integrated circuit in response to the localized heat being applied to the scan area indicative of sensitivity to RTS noise:
the RTS processing and system control is further configured to identify at least one smaller scan area from the scan area;
the heat-generating device is further configured to apply localized heat to the at least one smaller scan area;
the RTS measurement equipment is further configured to observe any change in one or more electrical parameters of the integrated circuit indicative of sensitivity to RTS noise in response to the localized heat being applied to the at least one smaller scan area; and
the RTS processing and system control is further configured to identify the location sensitive to RTS noise responsive to observing change in one or more electrical parameters of the integrated circuit indicative of sensitivity to RTS noise in response to the localized heat being applied to the at least one smaller scan area.

13. The system of claim 10, wherein the RTS processing and system control is further configured to identify a semiconductor structure proximate to the location as a source of the RTS noise.

14. The system of claim 13, wherein the semiconductor structure comprises a metal-oxide-semiconductor field-effect transistor.

15. The system of claim 10, wherein the RTS measurement equipment is configured to observe change in one or more electrical parameters of the integrated circuit indicative of sensitivity to RTS noise in response to the localized heat being applied to the scan area by observing average pulse widths of an electrical signal as a function of temperature of a scan area applied by the localized heat.

16. The system of claim 10, wherein the heat-generating device is further configured to apply localized heat to a scan area of the integrated circuit by applying photonic energy to the scan area.

17. The system of claim 16, wherein the heat-generating device comprises a laser.

18. The system of claim 10, further comprising:
the heat-generating device is further configured to apply heat to an entirety of the integrated circuit;
the RTS measurement equipment is further configured to observe any change in one or more electrical parameters of the integrated circuit in response to the heat being applied to the entirety of the integrated circuit;
the RTS processing and system control is further configured to identify whether the integrated circuit is sensitive to RTS noise responsive to observing change in one or more electrical parameters of the integrated circuit indicative of sensitivity to RTS noise in response to the heat being applied to the entirety of the integrated circuit; and
responsive to identifying the integrated circuit is sensitive to RTS noise:
the heat-generating device is configured to apply localized heat to the scan area of the integrated circuit;
the RTS measurement equipment is configured to observe any change in one or more electrical parameters of the integrated circuit indicative of sensitivity to RTS noise in response to the localized heat being applied to the scan area; and
the RTS processing and system control is configured to identify the location sensitive to RTS noise responsive to observing change in one or more electrical parameters of the integrated circuit indicative of sensitivity to RTS noise in response to the localized heat being applied to the scan area.

* * * * *